United States Patent [19]

Kumomi

[11] Patent Number: 5,318,661
[45] Date of Patent: Jun. 7, 1994

[54] PROCESS FOR GROWING CRYSTALLINE THIN FILM

[75] Inventor: Hideya Kumomi, Tokyo, Japan

[73] Assignee: Canon Kabushiki Kaisha, Tokyo, Japan

[21] Appl. No.: 989,892

[22] Filed: Dec. 10, 1992

Related U.S. Application Data

[63] Continuation of Ser. No. 742,016, Aug. 8, 1991, abandoned.

[30] Foreign Application Priority Data

Aug. 8, 1990 [JP] Japan .................. 2-208174

[51] Int. Cl.⁵ .............................................. C30B 1/02
[52] U.S. Cl. .......................................... 117/8; 437/24; 437/233
[58] Field of Search ................ 156/603, DIG. 73; 437/24, 233

[56] References Cited

U.S. PATENT DOCUMENTS 3,900,345 8/1975 Lesk ........................ 437/24
4,904,611 2/1990 Chiang et al. ............. 437/24

FOREIGN PATENT DOCUMENTS 0306154 3/1989 European Pat. Off. .
422864 4/1991 European Pat. Off. ............ 156/603
58-56406 4/1983 Japan .
61-261285 11/1986 Japan .
62-167295 7/1987 Japan .
63-253616 10/1988 Japan .
01245509 9/1989 Japan .................. 156/603

OTHER PUBLICATIONS

R. Reif., et al. Electronics Letters, vol. 17, No. 17 (Aug. 20, 1981) pp. 586–588.
I.-W. Wu, et al., Journal of Applied Physics, vol. 65, No. 10 (May 15, 1989) pp. 4036–4039.
N. Yamauchi, et al., International Electron Devices Meeting, (Washington, D.C. Dec. 3–6, 1989) pp. 13.5.1–13.5.4.
Wu et al., "Retardation of Nucleation Rate for Grain Size Enhancement." J. Appl. Phys. 65 (10), May 15, 1989, pp. 4036–4039.
"Low-Temperature Process to Increase the Grain Size in Polysilicon Films." Electronics Letters, Aug. 20, 1981, vol. 17, No. 17, pp. 586–588.

*Primary Examiner*—Robert Kunemund
*Attorney, Agent, or Firm*—Fitzpatrick, Cella, Harper & Scinto

[57] ABSTRACT

A process for growing a crystalline thin film comprises forming a crystalline region comprising a single crystal-nucleus or crystal-grain at a predetermined position of an amorphous thin film, then implanting ions of at least one element constituting the amorphous thin film into a region other than the crystalline region and thereafter carrying out heat treatment to have the crystal-nucleus or crystal-grain grown along the plane direction of the amorphous thin film, thereby crystallizing the amorphous film by solid phase growth.

13 Claims, 3 Drawing Sheets

PROCESS FOR GROWING CRYSTALLINE THIN FILM

This application is a continuation of application Ser. No. 07/742,016 filed Aug. 8, 1991, now abandoned.

BACKGROUND OF THE INVENTION

1. Field of the Invention

This invention relates to a process for growing a crystalline thin film to be used for electronic devices, optical devices, etc. of semiconductor integrated circuits. More particularly, it relates to a process for growing a crystalline thin film which can form the film at a relative lower temperature by controlling the nucleation positions of a plurality of thin film crystal grains, and can control also the position of the grain boundary and the sizes of crystal grains, etc.

2. Related Background Art

In the field of crystal formation technique which permits an amorphous thin film formed on a substrate having no crystallinity such as an amorphous substrate, etc. to grow in solid phase to a polycrystalline thin film by heat treatment at a temperature not higher than the melting point, there have been proposed some processes for making the grain sizes of the crystal grains constituting the polycrystalline thin film larger.

For example, there has been reported a crystal formation process, in which a polycrystalline Si thin film with fine grain sizes having a film thickness of about 1000Å deposited by the LPCVD method on an amorphous SiO$_2$ surface is made amorphous by implantation of Si$^+$ ions, and then subjected to heat treatment in an N$_2$ atmosphere at about 600° C., thereby making the above Si thin film as made amorphous a polycrystalline thin film with the maximum grain size of about 5 μm (R. Reif and E. Knott, Electron. Lett. 17, 586 (1981)). Also in almost the same steps, by depositing the thin film previously in amorphous state and applying ion implantation thereinto, equal results are obtained (I.-W. Wu, A. Chiang, M. Fuse, L. Overcoglu and T. Y. Huang, J. Appl. Phys. 65, 4036 (1989)). Further, there is also a report that, by depositing the amorphous thin film previously at a further lower temperature, a polycrystalline thin film with grain sizes comparable to the foregoing two examples can be obtained without application of ion implantation.

When various electronic devices are formed on the polycrystalline thin films obtained by these processes, since the average grain size of the crystal grains is by far larger than conventional polycrystalline silicon, etc. as deposited by the LPCVD method, those with relatively higher performances can be obtained.

However, in these crystal formation processes, although the average grain size of the crystal grains of the thin film obtained are large, their grain size distribution and the position of the crystal grain boundary are not controlled. For, in this case, crystallization of the amorphous thin film takes place via the process in which crystal nuclei generated at random positions in the thin film grows along the plane direction while being restricted in growth in the film thickness direction to form flat crystal grains. Therefore the positions of the crystal grain boundaries formed at the contact points with the adjacent crystal grains are also randomly determined, whereby the grain sizes are distributed over a wide range. Accordingly, the following problems will ensue only if the average grain size of crystal grains is large.

For example, when an MOS transistor is formed by use of the above polycrystalline film, if the average grain size becomes comparable with the size of channel, the situation becomes such that no grain boundary is included in the channel portion or that several or more boundaries are included. Crystal grain boundary will be a great obstacle against electroconduction, and therefore in the region where the number of grain boundaries included in the channel is 0 to several, the electrical characteristics will be greatly changed depending on the number of the grain boundaries included in the channel (N. Yamauchi, J.-J. J. Hajjar and R. Reif, IEDM 89-353 (1989)). For this reason, when an integrated circuits, etc. are formed, there occurs a great variance in the characteristics between a plurality of devices, which has been a remarkable obstacle in production of devices, etc.

Figure 3A:
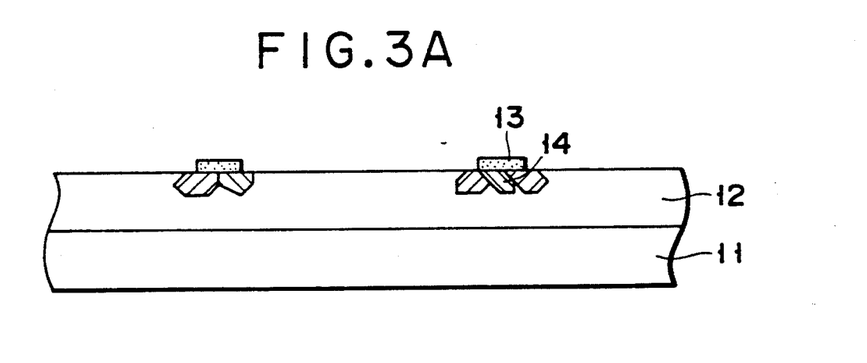
FIGS. 3A and 3B are schematic views showing an example of the formation method of a thin film crystal of the prior art.
Figure 3B:
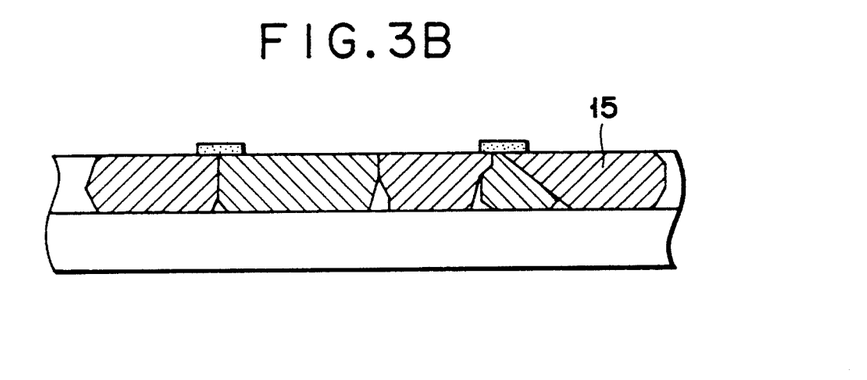

Of the problems in the large grain size polycrystalline thin film by the solid phase crystallization as described above, the method of inhibiting variance of grain sizes is disclosed in Japanese Laid-Open Patent Application No. 58-56406. That method is described by referring to FIGS. 3A and 3B. First, as shown in FIG. 3A, on the surface of an amorphous Si thin film 12 formed on an amorphous substrate 11 are provided periodically thin film small strips 13 made of another material, followed by annealing of the substrate as a whole by a conventional heating furnace. Then, in the amorphous Si thin film 12, formation of crystal nuclei 14 will occur preferentially from the site in contact with the peripheral of the thin film small strip 13. Accordingly, by growing further the crystal nuclei, the amorphous Si thin film 12 will be crystallized over the whole region, whereby a polycrystalline thin film comprising the crystal grain groups 15 with large sizes as shown in FIG. 3B is obtained. Japanese Laid-Open Patent Application No. 58-56406 states that the variance of grain sizes can be reduced to about ⅓ as compared with the prior art method previously shown.

However, even such method is still unsatisfactory. For example, when thin film small strips 13 are arranged in lattice points with intervals of 10 μm, the variance of grain sizes can be limited only to the range of 3 to 8 μm. Further, the crystal grain boundary position is not easily controlled under the present situation. The reason is that due to the localization effect of elastic energy at the portion where the amorphous Si thin film 12 is in contact with the peripheral portion of the thin film small strip 13, preferential nucleation occurs around the thin film small strip 13, whereby a plurality of nuclei will be generated along the peripheral, and their number is difficult to control.

Figure 4:
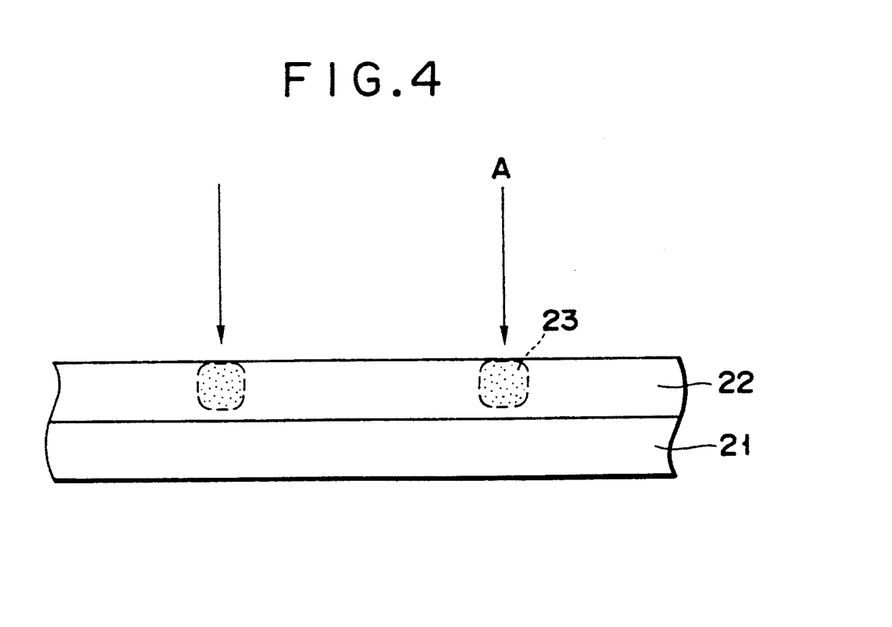
FIG. 4 is a schematic view showing another example of the formation method of a thin film crystal of the prior art.

Concerning the method of controlling the nucleation position in the solid phase growth of amorphous Si thin film, Japanese Laid-Open Patent Application No. 63-253616, etc. discloses other proposals. According to the method disclosed in the publication, as shown in FIG. 4, regions 23 are provided by implanting N$^+$ ions locally into the amorphous Si thin film 22 in the direction shown by the arrowhead A in the figure, and crystal nuclei are generated preferentially from the portions other than the regions 23. In the figure, 21 designates an amorphous substrate.

Further, for inhibiting variance of crystal grain sizes by arranging regularly the crystal grains having larger sizes and controlling the grain boundary positions, not only the regions where crystal nuclei are preferentially formed should be provided within the plane of the amorphous thin film, but at the same time in the areas around those regions, spontaneous nucleation must be inhibited while ensuring sufficient crystal growth rate. For example, in the method of Japanese Laid-Open Patent Application No. 58-56406, even if only a single crystal-nucleus may happen to be formed around the thin film small strip 13, if random nucleation has occurred in the film until it has reached 8 μm at the maximum as the grain size, its growth will be inhibited, whereby growth to a crystal grain with larger grain size than that is very difficult.

As described above, so many problems to be overcome have existed in the techniques proposed in the prior art.

SUMMARY OF THE INVENTION

The present invention has been accomplished in view of the state of the art as described above, and its object is to provide a process of growing a crystal thin film comprising crystal grain groups with large grain sizes with the grain boundary positions between the crystal grains and the grain sizes being controlled.

Another object of the present invention is to provide a process for growing a crystalline thin film, which comprises forming a crystalline region comprising a single crystal-nucleus or crystal-grain at a predetermined position of an amorphous thin film, then implanting ions of at least one element constituting the amorphous thin film into a region other than the crystalline region and thereafter carrying out heat treatment to have the crystal-nucleus or crystal-grain grown along the plane direction of the amorphous thin film, thereby crystallizing the amorphous thin film by solid phase growth.

DESCRIPTION OF THE PREFERRED EMBODIMENTS

A preferred embodiment of the process for growing a crystalline thin film of the present invention is as described below.

The process for growing a crystalline thin film of the present invention comprises forming a crystalline region comprising a single crystal-nucleus or crystal-grain at a predetermined position of an amorphous thin film, then implanting ions of at least one element constituting the amorphous thin film into a region other than the crystalline region and thereafter carrying out heat treatment to have the crystal-nucleus or crystal-grain grown along the plane direction of the amorphous thin film, thereby crystallizing the amorphous thin film by solid phase growth.

The present invention utilizes the fact that the crystal nucleation process in an amorphous thin film depends on the state of ion implantation into the thin film, the thickness of the thin film, the heat treatment temperature, etc. The present invention provides a process in which a region with different conditions of those states is formed within the plane of the amorphous film. By annealing the film at a temperature not higher than the melting point, preferentially a single crystal-nucleus is formed artificially at only specific position within the plane. This is grown in the plane direction to the periphery, wherein the randomly generated nucleus which interferes with the growth is removed by gradually making it amorphous by local ion implantation to elongate further growth in the plane direction.

According to the present invention, selective nucleation of a single crystal-nucleus in solid phase growth in an amorphous thin film which could not be realized in the method of the prior art is rendered possible. Further, it becomes possible to grow a group of crystal grains regularly arranged with uniform grain sizes to any desired grain size not restricted by the properties of the material. As the result, according to the formation method of the thin film crystal by the present invention, a thin film crystal comprising a group of crystal grains of large grain sizes controlled in the grain boundary position between the adjacent crystal grains and in the grain size can be obtained, whereby various devices of high performance with little variance in quality can be formed over a wide area, and the present process can be applied to preparation of semiconductor devices.

In the present invention, in order to accomplish the above objects, by forming a crystal region comprising a single (one) crystal-nucleus or crystal-grain at a predetermined position in an amorphous thin film, then implanting ions of at least one element constituting the above mentioned amorphous thin film into a region other than the above crystal region and thereafter carrying out heat treatment, the crystal-nucleus or crystal-grain is permitted to grow in the plane direction of the amorphous thin film, whereby the amorphous thin film is crystallized by solid phase growth.

Thus, in the present invention, it is utilized that the crystal-nucleus formation process within an amorphous thin film depends on the implanted state in ion implantation of the constituent substance of the amorphous thin film, the thickness of the thin film itself, the annealing temperature, etc.

In the present invention, after formation of a region with different nucleation processes within the plane of the amorphous thin film, by annealing the region at a temperature not higher than the melting point, a single crystal-nucleus is preferentially formed surely only at a specific position within the plane. In further growing the nucleus in the surrounding plane direction, by repeating plural times the two steps, namely the step of implanting ions locally into a region other than the crystal region comprising the desired crystal-nucleus or crystal-grain and the step of growing the crystal-nucleus or crystal-grain in the plane direction by heat treatment as desired, a crystalline thin film comprising a group of crystal grains of large grain sizes and controlled in the grain boundary position and the grain size is obtained.

In the following, the formation process of the crystalline thin film according to the present invention is described in detail.

Generally speaking, when an amorphous thin film formed on a subbing substrate having no crystalline surface is recrystallized as solid phase by annealing at a temperature not higher than the melting point, crystallization begins with spontaneous nucleation of a crystal nucleus in the amorphous thin film as the base point.

And, when the film thickness of the amorphous thin film is sufficiently thin relative to the growth rate of the crystal grain after nucleation and the nucleation frequency in the film, the crystal grains nucleated within the film will immediately grow in the film thickness direction of the thin film, and thereafter grow along the plane direction of the thin film.

Figure 1A:
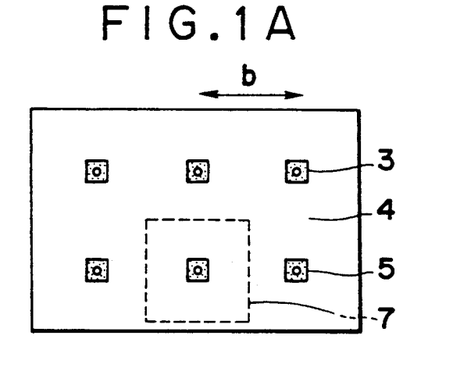
FIGS. 1A-1G and FIGS. 2A-2G are respectively plan views and sectional views showing an example of the steps of the formation method of a thin film crystal according to the present invention.
Figure 2A:
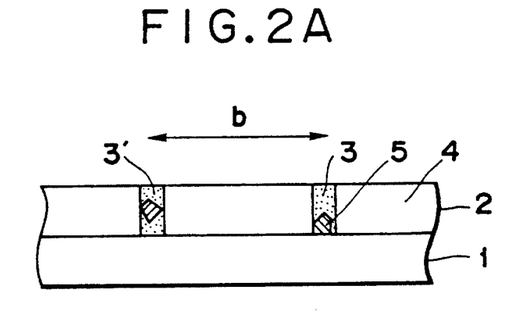

Therefore, in order to grow flat crystal grains of uniform sizes regularly arranged in such crystallization process, it is first required to form preferentially a single crystal-nucleus at a two dimensionally any desired position within the amorphous thin film plane. As shown in FIG. 1A and FIG. 2A, a nucleation region 3 susceptible to nucleation may be arranged within the amorphous thin film 2 on the subbing substrate 1 periodically so as to be surrounded by a non-nucleation region 4 difficulty susceptible to nucleation, and a single crystal-nucleus 5 may be selectively formed within those nucleation regions 3.

Figure 1B:
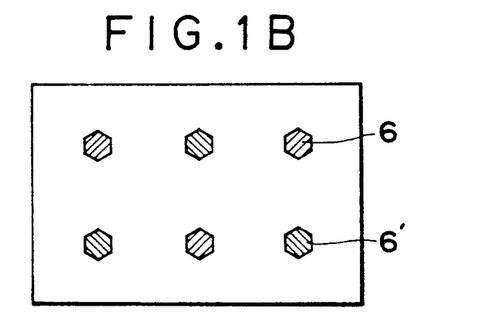
Figure 2B:
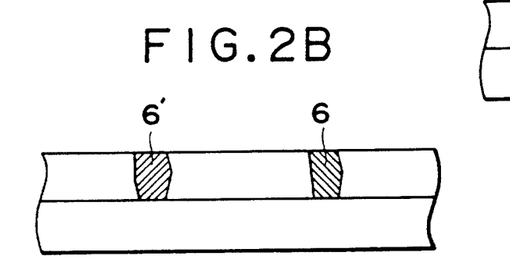

What gives selectivity concerning nucleation between the two kinds of regions is difference in incubation time of nucleation. When the amorphous thin film is annealed to be crystallized in solid phase, it has been well known in the art that incubation time is observed from initiation of annealing to the initial occurrence of nucleation. As the result of the studies by the present inventors of the present invention, according to the approaches as described in detail below, the method for controlling such incubation time and the method for forming simultaneously a region having different incubation times within the plane of amorphous thin film have been found. And, by restricting the area of the nucleation region by the probability which gives the nucleation frequency in that region, a single crystal-nucleus can be formed there. Further, if the crystal-nucleus formed first in each nucleation region completely embeds the region through the growth of its own before generation of the subsequent crystal nucleus within the region (FIG. 1B and 2B), selective formation of the single crystal-grain 6 will be completed.

Figure 1C:
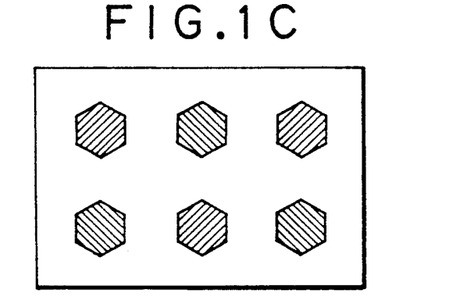
Figure 1D:
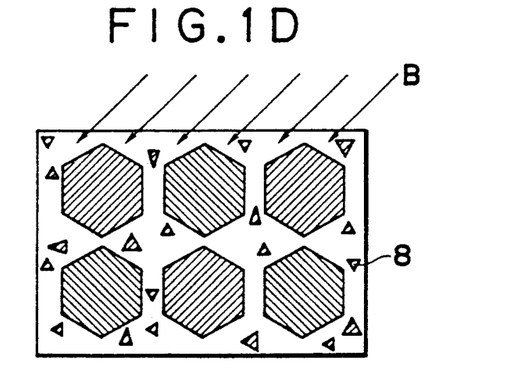
Figure 1E:
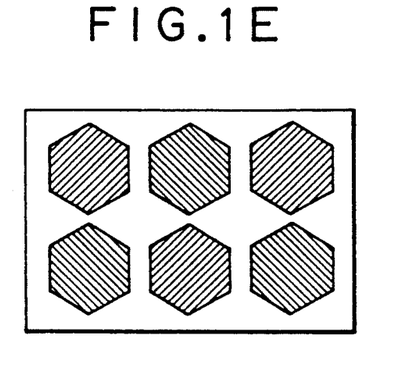
Figure 1F:
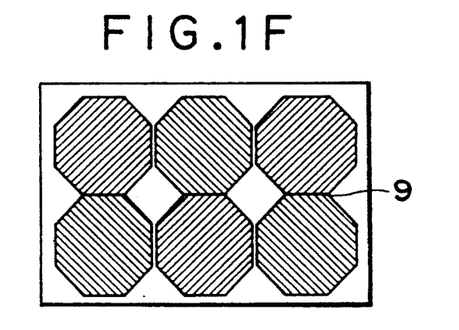
Figure 1G:
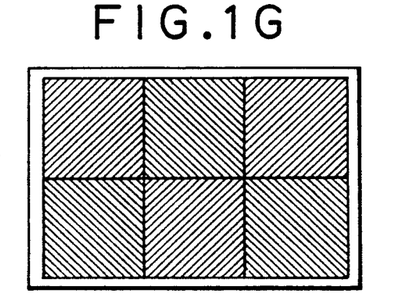
Figure 2C:
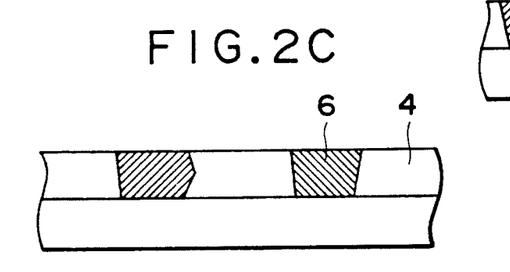
Figure 2D:
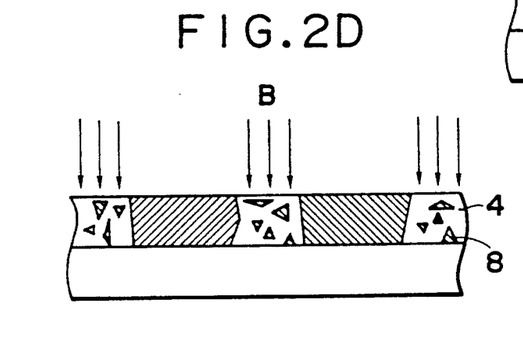
Figure 2E:
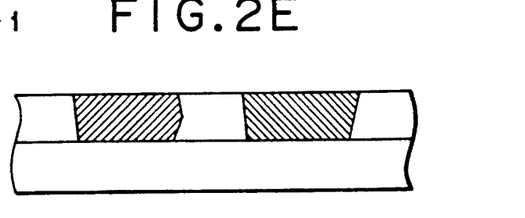
Figure 2F:
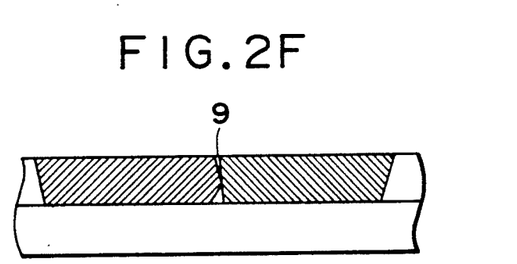
Figure 2G:
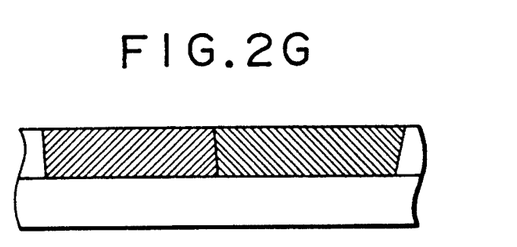

Once selective formation of single crystal-grain has been successful, then they are permitted to grow in the plane direction to the surrounding non-nucleation regions 4 (FIGS. 1C and 2C). Here, if the nucleation incubation time $\tau_b$ in the non-nucleation region 4 is sufficiently longer relative to the ratio of the distance b between the nucleation regions and the crystal growth speed $v_b$, the crystal-grain 6 will form a crystal-grain boundary with the crystal grain 6' grown from the adjacent nucleation region 3' with the growth end faces contacted with each other. And, before formation of spontaneous nucleation in the non-nucleation region, by growth of the crystal-grain 6 selectively formed in one nucleation region to the peripheral of Wigner-Seits Cell 7 (the region surrounded by the vertical bisectors between the nearest lattice points) with the respective nucleation regions as the lattice points, a polycrystalline film with uniform crystal grain boundary positions and grains sizes is obtained. However, under such state, the maximum grain size, namely the value b obtained will be restricted by the nucleation incubation time $\tau_b$ and the crystal growth speed $v_b$. Therefore, if the value of b is enlarged in order to obtain larger grain size, in the non-nucleation region 4 where no crystallization has occurred but amorphous state remains, crystal nuclei 8 will be randomly generated (FIGS. 1D and 2D). Accordingly, ions are implanted from the direction shown by the arrowhead B locally into the regions other than the crystal grain 6 grown from the nucleation region, the random crystal nuclei 8 interfering with further planar direction growth of the crystal grain 6 are made amorphous (FIGS. 1D, 1E, 2D and 2E). And, by subsequent heat treatment to urge growth of the crystal grain 6, to the nucleation incubation time $\tau'_b$ reelongated from that point by local ion implantation, the growth along the plane direction can be elongated. Still, if the crystal grain 6 does not embed completely the Wigner-Seits Cell 7, the local ion implantation and the growth by heat treatment as described above may be repeated again. Then, at last, the crystal grain 6 will form a crystal grain boundary 9 with the crystal grain 6' grown from the adjacent nucleation region 3' with the growth end faces contacted with each other (FIGS. 1F and 2F), thereby crystallizing all of the Wigner-Seits Cell 7, to complete the growth (FIGS. 1G and 2G). By this, a polycrystalline thin film with any desired grain size not restricted by the physicochemical values of the material can be formed while controlling the grain boundary position and the crystal grain sizes thereof.

In the crystal growth process as described above, by repeating the steps D to F for many times, the size of b, namely the crystal grain size can be enlarged as desired in principle. That is, the crystal grain size can be enlarged without limit. Also, the steps of D and F are not necessarily required to be repeated alternately independently, but if continuous local ion implantation is possible, it may proceed simultaneously with the growth by heat treatment. Further, local ion implantation is not required to avoid strictly the desired crystal grains, but the portion around the crystal grains inclusive thereof may be made amorphous.

Next, in the growth method of the crystalline thin film according to the present invention, the control methods of the incubation time of nucleation and nucleation frequency in amorphous thin film indispensable for practicing selective nucleation in nucleation region are described.

Firstly, the present inventors have found that formation of crystal nuclei in amorphous thin film can be inhibited by ion implantation of the constituent element of the above amorphous thin film practiced before the heat treatment for crystallization. Besides, in that case, the incubation time of nucleation and the nucleation frequency can be controlled by the implantation energy or the implantation dose in ion implantation For example, as for the incubation time of nucleation, when the energy of ion implantation into an amorphous thin film with a certain film thickness is varied, it has been found that the projection flight distance of implanted ions becomes just equal to the film, that is, continuously varied while exhibiting the maximum at the energy positioned at the interface with the subbing substrate surface. Also, the nucleation frequency, similarly as the incubation time, gave the lowest value when ions were implanted at the energy where the projection flight distance is positioned at the interface. Further, as the result of examination by varying the implanted dose with the implantation energy being fixed, the incubation time of nucleation time was elongated with the increase of the dose to a certain level, and the nucleation frequency was lowered.

Accordingly, by forming the nucleation region and the non-nucleation region with different states of ion implantation within the plane of the amorphous thin film on the subbing substrate, and setting the respective areas and geometrical shapes and the nucleation frequency-nucleation incubation time within the region so as to satisfy the conditions as mentioned above, the crystal nucleus will be preferentially formed in the nucleation region by the heat treatment.

Secondly, the present inventors have found that the nucleation process of the crystal nucleus in the amorphous thin film depends on the film thickness of the thin film itself. That is, generally speaking, as the film thickness of the thin film is thicker, the incubation time of nucleation in the heat treatment step is short and the nucleation frequency becomes higher. Accordingly, when crystallization has been completed, provided that the use of the crystallized thin film is not impaired, presence of a region with locally thick film thickness will be useful. That is, an amorphous thin film having a nucleation region with thicker film thickness and a non-nucleation region with thinner film thickness provided within the plane is formed on a subbing layer. Then, by carrying out the heat treatment, a crystal nucleus is formed preferentially in the nucleation region, and its single nucleus will crystallize all within the nucleation region.

In the selective nucleation method as described here, for further elongating the nucleation incubation time in the non-nucleation region and lowering the nucleation frequency, it is also possible to use the nucleation control by the ion implantation as described above in combination.

Thirdly, the present inventors have contrived a method for effecting crystallization while giving a temperature distribution within the plane of an amorphous thin film. When the crystal growth process comprising nucleation and nucleus growth subsequent thereto is practiced under a system which can be approximated to thermal equilibrium state, it has been well known that the various amounts describing the respective processes exhibit the active type dependency on the temperature. According to the detailed experiments by the present inventors, the crystallization process under the solid phase state of an amorphous material has been also verified to be thermally active type without exception. That is, as the heat treatment temperature is higher, the nucleation incubation time is shortened, the nucleation frequency increased, and the crystal growth speed improved.

Accordingly, when an amorphous thin film provided on a subbing substrate is subjected to heat treatment while giving a temperature distribution within the plane thereof so that a nucleation region with higher temperature and a non-nucleation region with lower temperature may be formed, crystal nucleus will be generated preferentially in the nucleation region.

In the selective nucleation method described here, for further elongating the nucleation incubation time in the non-nucleation region and lowering the nucleation frequency, the nucleation control by ion implantation as described above and the method by film thickness distribution can be also used in combination.

Also, in the first method as described above, as a matter of course, and also in the second and the third methods, by addition of the step of ion implantation prior to the initial heat treatment, the thin film initially formed on the subbing substrate is not necessarily required to be under amorphous state. For example, even if the thin film may be formed as a material having crystallinity such as a polycrystal, there is no problem because it can be made amorphous in the ion implantation step as described above.

In the present invention, as the thin film formed on a subbing substrate and crystallized by solid phase growth, for example, there are silicon thin film, germanium thin film, gallium arsenic thin film, etc., and the acceleration energy and the dose of the ions implanted into these thin films, which may also depend on the film thickness of the thin film, may be preferably 50 to 150 keV and $1 \times 10^{14}$ to $1 \times 10^{16}$ ions·cm$^{-2}$ in the case of a silicon thin film with a film thickness of 1000Å, 50 to 200 keV and $5 \times 10^{14}$ to $5 \times 10^{16}$ ions·cm$^{-2}$ in the case of a germanium thin film, and 200 to 400 keV and $1 \times 10^{15}$ to $5 \times 10^{16}$ ions·cm$^{-2}$ in the case of implantation of Ga ions into a gallium-arsenic thin film. The heat treatment temperature should be preferably made 500° to 700° C. in silicon thin film, 300° to 500° C. in germanium thin film, and 400° to 600° C. in gallium arsenic thin film.

In the following, specific examples in which the crystal growth method according to the present invention is applied to growth of semiconductor crystal thin film are described.

EXAMPLE 1

First, on the surface of a molten quartz substrate was deposited according to conventional low pressure CVD method an amorphous Si thin film with a film thickness of 1000Å.

Subsequently for controlling the nucleation frequency in the region which later becomes the nucleation region of the amorphous thin film, Si ions accelerated to an energy of 70 keV were implanted at a dose of $4 \times 10^{14}$ ions·cm$^{-2}$ into the whole thin film. And, for providing a non-nucleation region, the following steps were applied. First, on the amorphous Si thin film, an SiO$_2$ film was deposited to about 2000Å according to conventional normal pressure CVD method, which was subjected to patterning by use of conventional photolithographic steps and the RIE method so that regions each of 1.2 μm square may remain at square lattice point positions of 10 μm intervals and the film thickness of the SiO$_2$ film in other regions may be reduced to 1/10. On the whole surface of the substrate having the SiO$_2$ surface subjected to patterning, Si ions accelerated to 90 keV were then implated at a dose of $2.5 \times 10^{15}$ ions·cm$^2$. By this, although implanted ions for the second time did not reach the amorphous Si thin film immediately beneath the regions of 1.2 μm square where the SiO$_2$ film remained with a thickness of 2000Å as such at all, in other regions the ions transmitted the extremely thin film with a film thickness of about 200Å to be injected into the amorphous Si, particularly around the interface with the subbing molten quartz substrate. Therefore the regions of 1.2 μm applied only with ion implantation for the first time because the nucleation regions, and other regions become non-nucleation regions.

Accordingly, this was placed in an N$_2$ atmosphere and subjected to heat treatment at a temperature maintained at 600° C. When 10 hours elapsed after initiation of the heat treatment, the flat plane image of the Si thin film was observed by a transmission electron microscope. As the result, single dendrite crystal grains having grain sizes of about 1.5 to 2.0 μm were beautifully arranged at the respective lattice point positions of 10 μm intervals. That is, this means that nucleation of single crystal-nuclei and selective formation of single crystal-grains in the regions which should become nucleation regions were successful. However, when the non-nucleation regions are further observed, it was recognized that nuclei which could be clearly regarded as the randomly generated nuclei already existed, although their grains sizes are very fine as some 100Å. At this point, although the number of the randomly generated nuclei is sparse, if the heat treatment is continued as such, normal growth of the desired crystal-grains grown from the nucleation regions will be impaired.

Accordingly, again ion implantation of Si was applied under the same conditions as in the ion implantation for the second time as described above. Since the $SiO_2$ film subjected to patterning still remains after the heat treatment in the foregoing steps, even by ion implantation for the third time, the grown crystal-grains had their outer shapes formed regularly. On the other hand, in the non-nucleation regions, the portions bulged out from the crystal-grains selectively formed in the nucleation regions are made amorphous and at the same time the randomly generated nuclei in question were completely made amorphous. In addition, also in the amorphous regions where structural relaxation progressed to some extent by heat treatment, disturbance of the structure was again introduced, whereby it was considered that the nucleation incubation time was further elongated.

Now, the product subjected further to heat treatment for 20 hours was observed, and consequently it was found that the Si thin film was crystallized over the whole region to give a crystallized thin film with crystal-grain groups with grain sizes of 10 μm being juxtaposed in shape of lattice.

Also, even when Si thin film was crystallized according to entirely the same steps as in the Example as described above except for depositing the Si thin film formed on the quartz substrate according to conventional LPCVD method initially in the polycrystalline state and setting the dose and the energy of ion implantation of Si for the first time $2 \times 10^{15}$ ions·cm$^{-2}$ 40 keV, respectively, the results substantially equal to the case starting from the amorphous state were obtained.

EXAMPLE 2

First, on an alumina substrate was deposited an amorphous Ge thin film with a film thickness of 800Å according to the vapor deposition method. Next, while maintaining the substrate temperature at 400° C. in vacuum, an electron beam converged to 0.5 μm in diameter was scanned at high speed on the Ge thin film surface, to effect heat treatment so that the electron beam was irradiated at 2 mW·s only at the sites of the lattice points of 20 μm intervals. Here, the regions where the electron beam is irradiated become higher in temperature than the surrounding portions to become nucleation regions, and other regions become non-nucleation regions.

When the plane image of the Ge thin film subjected to such heat treatment for 2 hours was observed by a transmission electron microscope, single dendrite crystal-grains having grain sizes of about 1 to 1.5 μm with the respective lattice point positions of 20 μm intervals irradiated with electron beam as the center were beautifully arranged. That is, this means that formation of single crystal-nuclei and growth of said crystal-nuclei were successful. Here, irradiation of electron beam was stopped, and the product subjected further only to the same heat treatment for 8 hours was observed. The crystal-grains regularly aligned were found to be grown to grain sizes of about 6 to 7 μm. However, at the same time, also in the regions other than those crystal-grains, fine crystal-nuclei were already generated.

Accordingly, on the surface of the Ge thin film was coated a photoresist, and according to conventional photolithographic steps, the resist was subjected to patterning so that regions of 5 μm square subjected to registration remained at the central portions of the respective grains regularly aligned. And, with the resist as the mask, Ge ions accelerated to an energy of 105 keV were implanted at a dose of $2 \times 10^{15}$ ions·cm$^{-2}$ to make the randomly generated nuclei amorphous.

Subsequently, the heat treatment was effected for 10 hours, and consequently the respective crystal-grains were found to be grown to the grain sizes of about 11 to 12 μm, and randomly generated nuclei began to appear. Accordingly, the local ion implantation step as described above was applied with the size of one resist mask being enlarged to 10 μm square. By further heat treatment for 10 hours, the grain size was grown to 16 μm or larger, and then again local ion implantation was effected by use of a resist mask of 15 μm square.

Then, the final heat treatment was carried out for 10 hours, and consequently the Ge thin film was crystallized over the whole region to become a crystalline thin film having crystal-grain groups with grain sizes of 20 μm juxtaposed in shape of lattice.

EXAMPLE 3

First, on the Si wafer surface was formed an amorphous $Si_3N_4$ thin film with a film thickness of 1000Å according to conventional LPCV method, and further on the thin film was deposited an amorphous GaAs thin film to a film thickness of 2000Å according to the molecular beam vapor deposition method.

And, the GaAs thin film was worked by etching according to conventional photolithographic steps, and the regions of 2 μm square arranged in lattice points of 15 μm intervals were left to remain, and other regions were reduced to about 500Å from the surface. Here, the regions of 2 μm square left to remain with a thickness of 2000Å as such become the nucleation regions, and other regions with film thickness being reduced to 1500Å become the non-nucleation regions.

On this surface is deposited as the cap layer an $SiO_2$ film to 500Å, and heat treatment applied in high vacuum while maintaining the substrate temperature at 480° C. When the flat plane image of the GaAs thin film subjected to such heat treatment for 10 hours was observed by a transmission electron microscope, single dendrite crystal-grains having grains sizes of about 4 to 5 μm were found to be arranged beautifully at the lattice point positions of 15 μm intervals. That is, this means that nucleation of single crystal-nuclei and growth of said crystal-nuclei in the region which should become the nucleation region were successful. However, at the same time, fine crystal-nuclei were found to be already generated in other regions than those crystal-grains.

Accordingly, in subsequent steps, the heat treatment was carried out by maintaining the substrate temperature at 460° C., and at the same time growth of crystal-grains was promoted while making the random crystal-nuclei generated or the random crystal-nuclei which are going to be generated by irradiating the converged ion beam of Ga accelerated to an energy of 300 keV. However, the converged ion beam was scanned at high speed while avoiding the region of the crystal-grains grown from the nucleation region. That is, the non-irradiated region was continuously enlarged corresponding to the growth of crystal-grains.

When such continuous treatment was continued for 20 hours, the GaAs thin film was crystallized over the whole region to become a crystallized thin film having the crystal-grain groups with grain sizes of 15 μm juxtaposed in the shape of a lattice.

What is claimed is:

1. A process for growing a crystalline thin film, which comprises: (a) forming a crystal-forming region comprising a single crystal-nucleus or crystal-grain at a selected position of an amorphous thin film; (b) conducting a first heat-treating to crystallize the amorphous thin film based on the single crystal-nucleus or the crystal-grain; (c) implanting ions of at least one element constituting the amorphous thin film into a region other than the crystal-forming region to prevent generation of any additional single crystal-nucleus; and (d) thereafter conducting a second heat-treating to grow the crystalline thin film.

2. The process according to claim 1, wherein said ion implantation and said second heat treatment are carried out for plural times.

3. The process according to claim 1, wherein said amorphous thin film has a region with a difference in film thickness, and said crystal-forming region is formed in said region.

4. The process according to claim 1, wherein crystalline in said second heat-treating is effected while giving a temperature distribution to said amorphous thin film.

5. The process according to claim 1, wherein said amorphous thin film comprises silicon.

6. The process according to claim 5, wherein said ions are silicon ions and $1 \times 10^{14}$ to $1 \times 10^{16}$ ions·cm$^{-2}$ are implanted at 50 to 150 keV.

7. The process according to claim 5, wherein said second heat treatment is carried out at 500° to 700° C.

8. The process according to claim 1, wherein said amorphous thin film comprises germanium.

9. The process according to claim 8, wherein said ions are germanium ions and $5 \times 10^{14}$ to $5 \times 10^{16}$ ions·cm$^{-2}$ are implanted at 50 to 200 keV.

10. The process according to claim 8, wherein said second heat treatment is carried out at 300° to 500° C.

11. The process according to claim 1, wherein said amorphous thin film comprises gallium-arsenic.

12. The process according to claim 11, wherein said ions are gallium and ions and $1 \times 10^{15}$ to $5 \times 10^{16}$ ions·cm$^{-2}$ are implanted at 200 to 400 keV.

13. The process according to claim 11, wherein said second heat treatment is carried out at 400° to 600° C.

* * * * *

UNITED STATES PATENT AND TRADEMARK OFFICE
CERTIFICATE OF CORRECTION

PATENT NO. : 5,318,661
DATED : June 7, 1994
INVENTOR(S) : HIDEYA KUMOMI

It is certified that error appears in the above-identified patent and that said Letters Patent is hereby corrected as shown below:

ON TITLE PAGE

In [56] References Cited, under OTHER PUBLICATIONS:
      "R. Reif., et al." (etc.) and "I.-W. Wu, et al.," (etc.)
      should be deleted.

COLUMN 2

Line 13, "an" should be deleted.
    Line 51, "peripheral," should read --periphery,--.

COLUMN 5

Line 38, "nucleus" should read --nuclei--.
    Line 41, "crystal-grain" should read --crystal grains--.
    Line 54, "peripheral" should read --periphery--.

COLUMN 8

Line 43, "implated" should read --implanted--.

COLUMN 10

Line 31, "And, the" should read --Also, the--.

COLUMN 11

Line 7, "single crystal-nucleus" should read
        --single-crystal nucleus--   and
        "crystal-grain" should read --crystal grain--.
    Line 9, "heat-treating" should read --heat treatment--.
    Line 10, "single crystal-nucleus" should read
        --single-crystal nucleus--.

UNITED STATES PATENT AND TRADEMARK OFFICE
CERTIFICATE OF CORRECTION

PATENT NO. : 5,318,661
DATED : June 7, 1994
INVENTOR(S) : HIDEYA KUMOMI

It is certified that error appears in the above-identified patent and that said Letters Patent is hereby corrected as shown below:

<u>COLUMN 11</u>

Line 12, "crystal-grain;" should read --crystal grain;--.
    Line 15, "single crystal-nucleus," should read
           --single-crystal nucleus,--.
    Line 16, "heat-treating" should read --heat treatment--.

<u>COLUMN 12</u>

Line 2, "line" should read --lization-- and
           "heat-treating" should read --heat treatment--.
    Line 20, "and ions" should read --ions--.

Signed and Sealed this

Twenty-second Day of November, 1994

Attest:

BRUCE LEHMAN

*Attesting Officer*      *Commissioner of Patents and Trademarks*